(12) United States Patent
Clark et al.

(10) Patent No.: US 12,633,914 B2
(45) Date of Patent: May 19, 2026

(54) METHOD OF FORMING AND OPERATING A SOLID-STATE RELAY DEVICE

(71) Applicant: Integense Microelectronics Inc., San Diego, CA (US)

(72) Inventors: Ron Clark, Poway, CA (US); Sung Kim, San Jose, CA (US); Chris Edwards, Sunnyvale, CA (US); Albert Bergemont, Incline Village, NV (US); Douglas Vargha, Mountain View, CA (US); Michael Dueweke, Campbell, CA (US)

(73) Assignee: INTEGENSE MICROELECTRONICS, INC., San Diego, CA (US)

( * ) Notice: Subject to any disclaimer, the term of this patent is extended or adjusted under 35 U.S.C. 154(b) by 30 days.

(21) Appl. No.: 18/923,326

(22) Filed: Oct. 22, 2024

(65) Prior Publication Data

US 2025/0253844 A1 Aug. 7, 2025

Related U.S. Application Data

(60) Provisional application No. 63/549,663, filed on Feb. 5, 2024.

(51) Int. Cl.
*H03K 17/56* (2006.01)
*H01F 38/14* (2006.01)

(52) U.S. Cl.
CPC ............ *H03K 17/56* (2013.01); *H01F 38/14* (2013.01)

(58) Field of Classification Search
CPC ........................................................ H03K 17/56
USPC .................................................. 327/108–112
See application file for complete search history.

(56) References Cited

U.S. PATENT DOCUMENTS 12,476,461 B2 * 11/2025 Lumanog .................. H02J 3/38

* cited by examiner

*Primary Examiner* — Tomi Skibinski
(74) *Attorney, Agent, or Firm* — FisherBroyles, LLP

(57) ABSTRACT

A method of operating a solid-state relay device includes receiving an input signal at an input of the solid-state relay device and coupling the input signal to transmit circuitry disposed on a transmit die. In response to receiving the input signal the transmit circuitry generates a corresponding time varying electrical voltage that is coupled from the transmit circuitry to a transmit coil and a receive coil is induced to generate an intermediate signal. A switch drive signal is generated which transitions a solid-state switch from an off state to an on state, wherein the switch drive signal corresponds to the input signal and wherein the drive signal is electrically isolated from the input signal.

20 Claims, 11 Drawing Sheets

METHOD OF FORMING AND OPERATING A SOLID-STATE RELAY DEVICE

CROSS-REFERENCES TO OTHER APPLICATIONS

This application claims priority to U.S. provisional patent application Ser. No. 63/549,663, for "SIGNAL ISOLATOR WITH INTEGRAL ELECTROMAGNETIC SHIELD" filed on Feb. 5, 2024, the contents of all of which are hereby incorporated by reference in their entirety for all purposes.

This application is related to the following concurrently filed and commonly assigned U.S. nonprovisional patent applications:
[to be filled in after filing]
each of which is hereby incorporated by reference in its entirety for all purposes.

FIELD

The described embodiments relate generally to electronic devices that isolate an input signal from an output signal. More particularly, the present embodiments relate to electronic devices that receive an input signal and in response generate an isolated drive signal to a solid-state switch that transitions from an off state to an on state.

BACKGROUND

Currently there are a wide variety of electronic devices that isolate input signals from output signals. Current electronic devices have limited operating voltages and relatively low coupling coefficients. Further, many of the current electronic devices are relatively large and/or require the interconnection of separate discrete components.

There is a need for signal isolator devices that are integrated, compact and that operate at relatively high voltages with relatively high coupling coefficients.

SUMMARY

In some embodiments a signal isolation device comprises a transmit die including a pair of input terminals coupled to a pair of transmitter output terminals. A receiver die includes a pair of receiver input terminals, a pair of output terminals and a coupler region, wherein the transmit die is attached to a top surface of the receiver die. The coupler region includes a transmit coil connected to the pair of transmitter output terminals, a receiver coil positioned proximate the transmit coil and connected to the pair of output terminals, receiver circuitry and a shield layer positioned between the receiver circuitry and the receiver coil. In various embodiments the signal isolation device includes a signal generator that generates a time varying electrical voltage at the pair of transmitter output terminals in response to receiving an input signal at the pair of input terminals.

In some embodiments the time varying electrical voltage is coupled to the transmit coil, and in response to receiving the time varying electrical voltage the transmit coil induces the receiver coil to generate an intermediate signal corresponding to the input signal. In various embodiments the receiver die includes a power converter circuit that receives the intermediate signal, and in response the power converter circuit generates a DC voltage. In some embodiments the receiver die includes a driver circuit that generates a switch drive signal in response to receiving the DC voltage. In various embodiments the switch drive signal is coupled to a transistor that transitions from an off state to an on state in response to receiving the switch drive signal.

In some embodiments the signal isolation device further comprises a power storage device coupled to control circuitry, wherein the control circuitry is arranged to receive the intermediate signal and in response to receiving the intermediate signal the control circuitry causes the power storage device to generate a DC signal. In various embodiments the receiver die includes a power converter circuit arranged to receive the intermediate signal, and in response to receiving the intermediate signal the power converter circuit generates a first DC signal at a first voltage and a second DC signal at a second voltage, wherein the first voltage is greater than the second voltage. In some embodiments the receiver circuitry includes data communications circuitry that demodulates a data signal from the intermediate signal. In various embodiments the signal isolation device further comprises an encapsulant that at least partially encapsulates the transmit die and the receiver die.

In some embodiments a signal isolation device comprises a transmit die including an input coupled to a transmitter output; and a receiver die including a receiver input, an output and a coupler region, wherein the receiver input is connected to the transmitter output and wherein the coupler region includes a transmit coil connected to the receiver input, a receiver coil connected to the output, receiver circuitry, and a shield positioned between the receiver circuitry and the receiver coil.

In various embodiments the signal isolation device the transmit die includes a signal generator that generates a time varying electrical voltage at the transmitter output in response to receiving an input signal at the input. In some embodiments a signal isolation device the time varying electrical voltage is coupled to the transmit coil, and wherein in response to receiving the time varying electrical voltage the transmit coil induces the receiver coil to generate an intermediate signal corresponding to the input signal.

In various embodiments the signal isolation device receiver die includes a power converter circuit that is arranged to receive the intermediate signal, wherein in response to receiving the intermediate signal the power converter circuit generates a first DC signal at a first voltage and a second DC signal at a second voltage, wherein the first voltage is greater than the second voltage. In some embodiments the signal isolation device the receiver circuitry includes data communications circuitry that demodulates a data signal from the intermediate signal.

In various embodiments the signal isolation device the receiver die includes a driver circuit that receives the DC signal and in response to receiving the DC signal the driver circuit generates a switch drive signal. In some embodiments the signal isolation device configured to couple the switch drive signal to a transistor that transitions from an off state to an on state in response to receiving the switch drive signal. In various embodiments the signal isolation device further comprising an encapsulant that at least partially encapsulates the transmit die and the receiver die.

BRIEF DESCRIPTION OF THE DRAWINGS

FIG. 6A illustrates an isometric bottom view of a signal isolation device electronic package, according to some embodiments of the disclosure;

FIG. 6B illustrates an isometric top view of the signal isolation device electronic package shown in FIG. 6A;

DETAILED DESCRIPTION

Figure 1A:
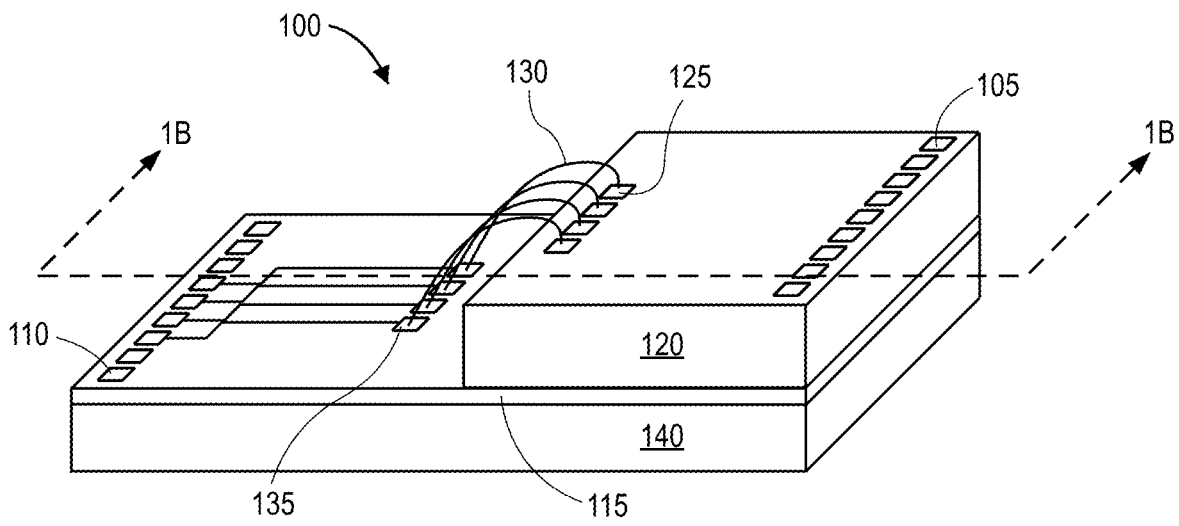
FIG. 1A depicts an illustrative rendering of a signal isolator, according to some embodiments of the disclosure.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Electronic devices often require signals to be communicated between two circuits while maintaining electrical isolation between the two circuits. The electrical isolation between the two circuits may be for safety, reliability, level translation, and/or multiplexing for example. Techniques disclosed herein relate generally to signal isolators that provide isolation between two circuits while providing a high coupling coefficient in a compact package that can accommodate relatively high voltages. Various inventive embodiments are described herein, including methods, processes, systems, devices, and the like.

In one example, a signal isolator forms a portion of a solid-state relay device that electrically isolates a control circuit from a circuit that is being controlled. In some examples the isolation between the two circuits may be for safety (e.g., to isolate a control circuit at a human interface from a power circuit that may have a high voltage that is hazardous to a human) while in other examples the isolation may be for level translation (e.g., the control signal is in one voltage domain (e.g., 3 volts) and the signal being controlled is in another domain (e.g., 1000 volts)). In further examples, a plurality of signals may be coupled through a single common electrical connection (e.g., a multiplexed input/output connection in an automated test equipment apparatus) and a corresponding plurality of signal isolators may be employed to select one signal at a time that is coupled to the common electrical connection. In yet further examples a signal isolator may be used to complete a remote connection between a power source and a load (e.g., to couple a starter motor of a car to a battery using a remote switch mounted within the passenger compartment) without the current and/or voltage of the power source coupled to the switch. In some examples the signal isolator may be used to filter out harmful or unwanted noise so the noise isn't coupled from one circuit to the other circuit. The signal isolators disclosed herein may use capacitive, inductive, radiative, optical, acoustic, mechanical or other suitable methods of coupling.

In one embodiment a signal isolator includes a transmit die attached to a receiver die. The transmit die includes input terminals that communicate a signal to a transmit coil formed on the receiver die. A receiver coil is formed adjacent to the transmit coil and is electrically isolated from and electromagnetically coupled to the transmit coil such that signals within the transmit coil are communicated to the receiver coil. The receiver die includes rectification, voltage amplification and driver circuitry that uses the signal from the receiver coil to operate a solid-state switch. In some embodiments an electronic package includes the transmit die, the receiver die and the solid-state switch.

Several illustrative embodiments will now be described with respect to the accompanying drawings, which form a part hereof. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

Signal Isolation Device

FIG. 1A depicts an illustrative rendering of a signal isolator, according to some embodiments of the disclosure. As shown in FIG. 1A, signal isolation device 100 includes a transmit die 120 attached to a receiver die 140. Transmit die 120 has input terminals 105 that receive an input signal and couple it through the transmit die to transmitter output terminals 125. The transmitter output terminals 125 transmit an output signal to receiver input terminals 135 of the receiver die 140. Receiver die 140 generates a corresponding receiver output signal at output terminals 110 while maintaining electrical isolation between the input terminals 105 and the output terminals 110, as described in more detail below.

One or more interconnects, for example wirebonds 130, may couple the transmitter output terminals 125 to the receiver input terminals 135 disposed on receiver die 140. Receiver die 140 couples a signal from the receiver input terminals 135 to coupler 115 that is formed on the receiver die. Coupler 115 can employ inductive, capacitive or other suitable structures to generate the output signal that corresponds to the input signal. In one example, coupler 115 employs a transmit coil that is inductively coupled to a receive coil (not shown in FIG. 1A). More specifically, when a transmitter output signal is received by the transmit coil a corresponding signal is generated in the receive coil and transmitted to output terminals 110. The transmit coil may be electrically isolated from the receive coil such that noise or other harmful or unwanted signals are not coupled from the input terminals 105 to the output terminals 110.

Figure 1B:
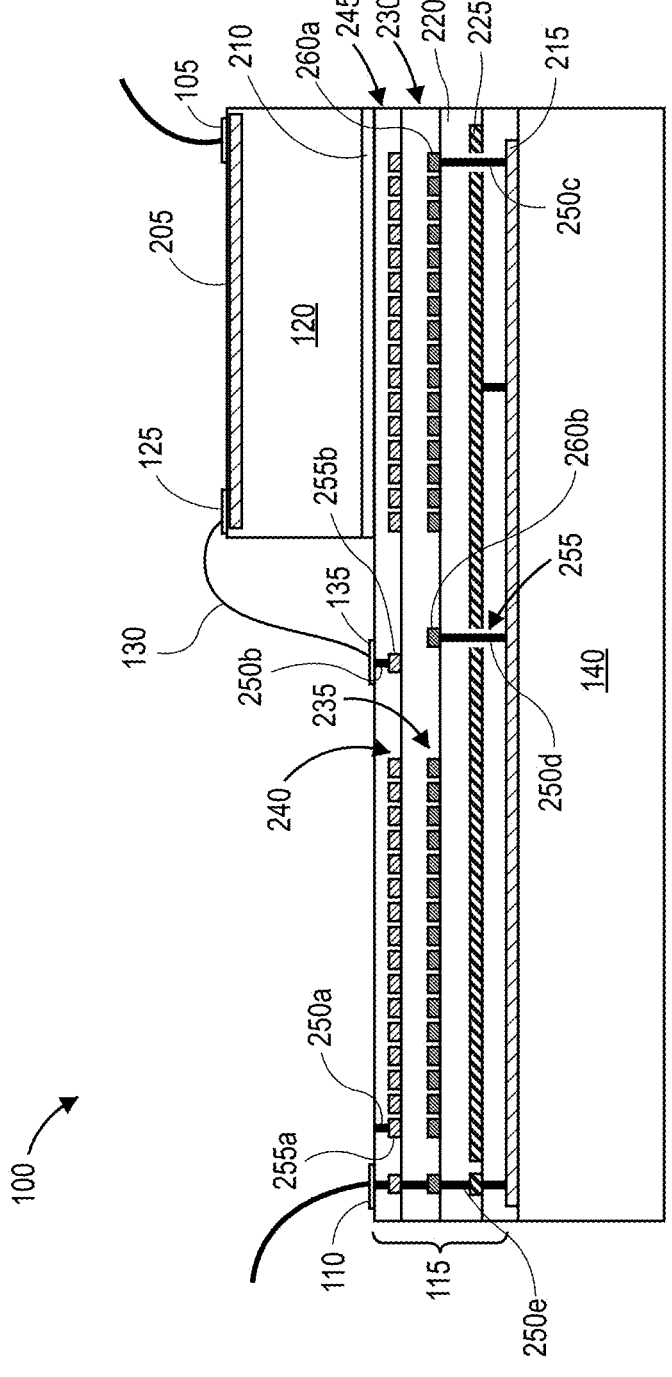
FIG. 1B depicts a simplified cross-sectional view of the signal isolator shown in FIG. 1A.

FIG. 1B depicts a simplified cross-sectional view of signal isolation device 100 shown in FIG. 1A. As shown in FIG. 1B, coupler 115 has been expanded vertically to more clearly show example features of this particular embodiment. Transmit die 120 may be any suitable type of semiconductor device including but not limited to silicon, and can include transmit circuitry 205 that may perform filtering, amplification, processing, conditioning and/or other suitable function to the one or more input signals, explained in more detail below. Transmit die 120 may be mechanically and thermally coupled to receiver die 140 via a bonding layer 210 that may be electrically insulative, electrically conductive and/or thermally conductive.

Receive die 140 may be any suitable type of semiconductor device, including but not limited to silicon, gallium nitride, gallium arsenide, silicon carbide, silicon germanium, diamond or other suitable material and can include receive circuitry 215 that may perform filtering, amplification, processing, conditioning, rectification, and/or other suitable function to the received signal, as explained in more detail below.

Coupler 115 is attached to receive die 140 and may include a plurality of electrically conductive layers which may be known as "redistribution layers" (RDLs), each separated by one or more dielectric layers 220 such as, for example, polyimide. A shield layer 225 is positioned above receive circuitry 215 and shields the receive circuitry from electromagnetic energy emitted by regions above the shield layer. In some embodiments shield layer 225 may be a continuous or semi-continuous metal layer electrically coupled to a ground potential while in other embodiments it may include two, three, four or more metal layers, some examples of which are described in more detail below.

Positioned above shield layer 225 is a receive coil layer 230. Receive coil layer 230 may include one or more spiral, or other suitable geometry receive coils 235 that are arranged to receive a signal inductively coupled from one or more corresponding transmit coils 240 formed in transmit coil layer 245. Transmit coils 240 are one or more spiral, or other suitable geometry coils that receive signals from transmit die 120 via transmitter output terminals 125, electrical conductors 130 and receiver input terminals 135. In some embodiments a width of each conductor that forms receive coil 235 and transmit coil 240 is between 5 and 40 microns, between 10 and 25 microns or between 12 and 20 microns. In some embodiments a height of each conductor that forms receive coil 235 and transmit coil 240 is between 1 and 40 microns, between 5 and 20 microns or between 5 and 10 microns. In various embodiments the conductors that form receive coil 235 and transmit coil 240 are made from an electrically conductive metal such as, but not limited to, copper, gold, silver, palladium, aluminum, or nickel.

In some embodiments a distance between transmit coil 240 and receive coil 235 may be between 0.1 and 400 microns, between 5 and 50 microns or between 10 and 15 microns. The distance between transmit coil 240 and receive coil 235 may be varied for different applications that require a particular coupling coefficient and a particular electrical isolation rating as the smaller the distance the higher the coupling coefficient and the lower the electrical isolation. In some embodiments a high dielectric strength material may be used such as, for example, parylene, polyvinylidenedifluoride (PVDF) nanocomposite, polyimide, silicon nitride, calcium titanate CaTiO3, or other suitable polymer and/or ceramic material to decrease the distance between the coils for applications that require an increased coupling coefficient with high electrical isolation. In some embodiments the coupling coefficient for transmit coil 240 and receive coil 235 may be greater than 0.6, greater than 0.7, greater than 0.8 or greater than 0.9. In some embodiments a distance between receive coil 235 and shield 225 is between 2 and 20 microns, between 3 and 10 microns or approximately 4 microns. In some embodiments a distance between shield 225 and receive circuitry 215 is between 0.1 and 20 microns, between 3 and 10 microns or approximately 4 microns.

In some embodiments one or more additional shield layers (not shown in FIGS. 1A and 1B) may be formed on receiver die 140 positioned above transmit coil 240 and/or on a lower surface of transmit die 120. The one or more additional shield layers may shield circuitry above the transmit and receive coils, 240, 235, respectively, from electromagnetic energy and may each be formed from one or more metal layers, such as those described in more detail below.

Vias 250 may electrically couple the one or more layers in coupler 115 together and route signals vertically through receive die 140. Corresponding apertures 255 may be formed in shield layer 225 to allow the vias 250 to pass through the shield layer while remaining electrically isolated from the one or more shield layers. For example, vias 250a, 250b may couple signals from receiver input terminals 135 to an outer winding 255a of transmit coil 240 and to an inner winding 255b of the transmit coil, respectively. Similarly, vias 250c, 250d may couple signals from an outer winding 260a of receive coil 235 and an inner winding 260b of receive coil, respectively, to receiver circuitry 215. Via 250e may couple signals from receiver circuitry 215 to a top surface of receiver die 140 to be coupled to a separate electronic device through output terminals 110.

Although signal isolation device 100 illustrates one particular arrangement of a transmit die, a transmit coil, a receive coil, a receiver die, vias, etc. one of skill in the art will appreciate that this disclosure is not limited to this particular arrangement and that other arrangements are within the scope of this disclosure.

Figure 1C:
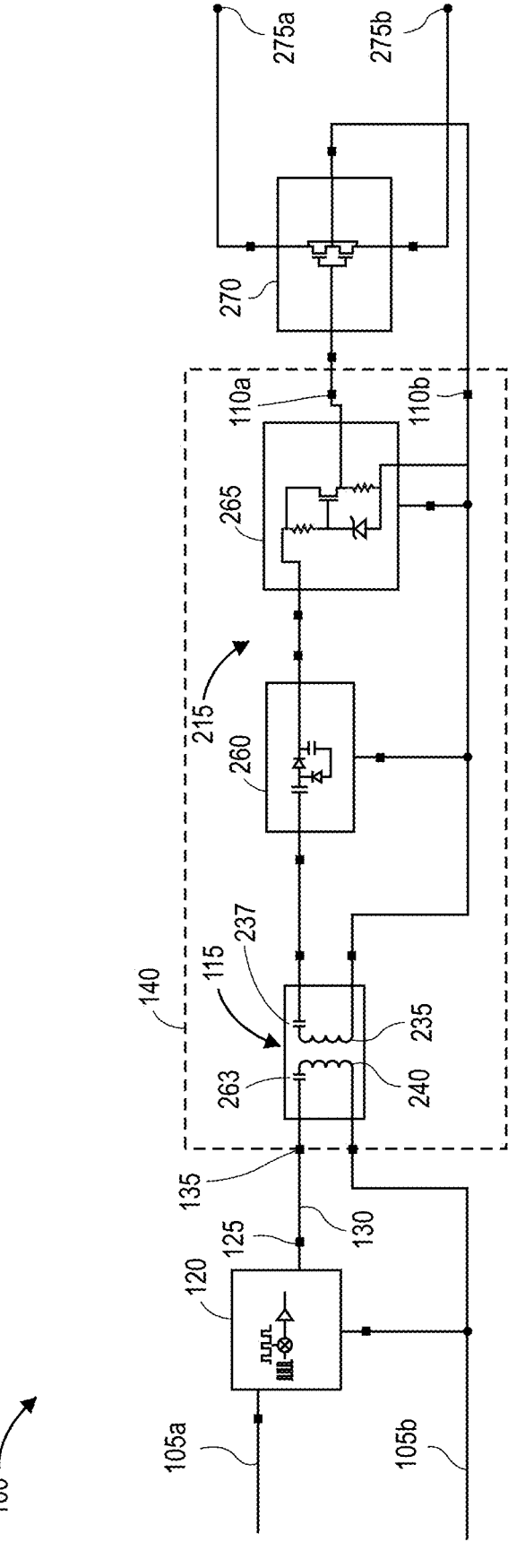
FIG. 1C illustrates a simplified block diagram of the signal isolator shown in FIGS. 1A and 1B.

FIG. 1C illustrates a simplified block diagram of signal isolation device 100, shown in FIGS. 1A and 1B. As shown in FIG. 1C, transmit die 120 includes input terminals 105a, 105b that are arranged to receive an input signal that is coupled to transmit coil 240 within coupler 115 by transmitter output terminals 125, electrical conductors 130 and receiver input terminals 135. Receive coil 235, within coupler 115, receives a signal corresponding to the input signal and transmits it to receiver circuitry 215 that generates a corresponding output signal at output terminals 110a, 110b. In this particular embodiment output terminals 110a, 110b, are coupled to a switch 270 that is in an on "conducting" state when an input signal is received at input terminals 105a, 105b and is in an off state "non-conducting state" when no input signal is received. Other embodiments of signal isolation device 100 may have different features and functions, some of which are described in more detail below.

In some embodiments, transmit die 120 can be arranged to receive any suitable input signal at input terminals 105a, 105b such as, for example, a steady state logic signal (e.g., 0 volts for an "off" signal and 5 volts for an "on" signal), or a varying input (e.g., an input of 10 kHz for an on signal and 0 kHz for an off signal). A logic circuit within transmit die 120 may determine when an on signal has been received at input terminals 105*a*, 105*b* and may cause a signal generator to generate a time varying electrical voltage (e.g., driving signal) that is coupled to transmit coil 240. In this particular embodiment transmit die 120 includes a pulse generator and a rectifier that generates a driver signal which is coupled to transmit coil 240 through transmitter output terminals 125, electrical conductors 130 and receiver input terminals 135. In some embodiments transmit coil 240 may be coupled to a capacitor 263 (e.g., forming an L C circuit) having a characteristic resonant frequency. Transmit die 120 may drive the L C circuit at its resonant frequency, while in other embodiments it may drive it below or above the resonant frequency. In some embodiments transmit die 120 may drive the L C circuit at a varied frequency, for example it may drive the L C circuit below resonance for a first period of time, then at resonance for a second period of time.

Within coupler 115, the time varying electrical signal within transmit coil 240 is electromagnetically coupled to receive coil 235. In some embodiments a ferrite or other material may be positioned between transmit coil 240 and receive coil 235 to increase the coupling coefficient between the two coils. Receive coil 235 may be coupled in series with a capacitor 237 (forming an L C resonant circuit) and may generate a signal corresponding to the drive signal in transmit coil 240. In some embodiments a resonance frequency of the transmit and receive coils may match while in another embodiment they may be different. In some embodiments a number of turns of transmit coil 240 and receive coil 235 may be equal while in other embodiments one may have a higher or lower number of turns than the other. The signal generated by receive coil 235 can be used by receiver die 140 to operate one or more switches, generate power and/or communicate data, as discussed in more detail herein.

In the embodiment illustrated in FIG. 1C receiver circuitry 215 includes a power converter 260 that may convert the power received from receiver coil 235 to a higher or lower voltage. In one embodiment power converter 260 is a charge-pump circuit that increases the voltage and may further include a rectifier that rectifies the time varying electrical signal received from receiver coil 235 to generate a DC voltage. In further embodiments power converter 260 may include a half-bridge, full-bridge or other suitable architecture of converter which may include any suitable AC to DC converter and/or DC to DC converter.

In further embodiments power converter 260 may include more than one power output that may supply a different voltage to one or more auxiliary circuits. In some embodiments power converter 260 may include two or more DC to DC converters that generate any suitable voltage for one or more auxiliary outputs. In further embodiments power converter 260 may include a low drop out regulator (LDO), a voltage divider or other circuit to generate a different "auxiliary" voltage.

In the embodiment illustrated in FIG. 1C, power converter 260 may rectify and increase a voltage of the signal received from receiver coil 235 and transmit the rectified and increased voltage signal to driver circuit 265. Driver circuit 265 may supply a drive signal to switch 270 when an "on" signal is detected by transmit die 120. Driver circuit 265 may include one or more pull-down and/or pull-up transistors to latch switch 270 in an on state or an off state and to supply the requisite voltage and current to switch 270.

In the embodiment illustrated in FIG. 1C, switch 270 is arranged as two switches connected back-to-back in a bidirectional configuration where both gates of both switches are simultaneously operated by driver circuit 265. However, in other embodiments, the switch may be a single integrated switch pair, or other suitable arrangement, e.g., a single MOSFET, HEMT, IGBT or other type of switch. When switch 270 is in an on state first relay terminal 275*a* is electrically coupled to second relay terminal 275*b* and when switch 270 is in an off state the first relay terminal is isolated from the second relay terminal. In some embodiments a plurality of switches, e.g., two, three, four or more (bidirectional or other type) may be operated by driver circuit 265 and/or switch 270.

In another embodiment, receive circuitry 215 may include data communications circuitry (not shown in FIG. 1C) that may be coupled to receive coil 235 and may be configured to demodulate a data signal from the receive coil. For example, in one embodiment transmit die 120 may include data modulation circuitry that couples data to transmit coil 240 such that the transmit coil may couple both a power signal to receive coil 235 (e.g., at 100 MHz) and a data signal (e.g., operating at 10 kHz) such that both power and data can be simultaneously transferred through coupler 115.

In further embodiments signal isolation device 100 may operate bidirectionally as a power and/or data communications system. More specifically, in one embodiment power and/or data may be transferred from transmit coil 240 to receive coil 235 and in reverse where power and/or data is transferred from receive coil 235 to transmit coil 240. For example, data may be communicated from receive coil 235 to transmit coil 240 while power is transferred from transmit coil 240 to receive coil 235 by receiver circuitry 215 changing an effective impedance of receive coil 235 which can be sensed by circuitry coupled to transmit coil 240 and received as data at transmit die 120. In some embodiments where the signal isolation device 100 is bidirectional, power converter 260 may include a bi-directional DC to DC converter such that signals or power received from output terminals 110*a*, 110*b*, may have a voltage level changed and/or inverted to an AC signal to communicate data and/or power to transmit die 120 and/or input terminals 105*a*, 105*b*. Thus, in some embodiments power transfer may be unidirectional in either direction while data transfer is bidirectional, in further embodiments both power and data may be bidirectional and in yet further embodiments data transfer can be unidirectional in either direction while power transfer is bidirectional.

In some embodiments, signal isolation device 100 may include a power storage device (e.g., co-packaged) and/or may be arranged to control a power storage device (e.g., a separate electronic device). In various embodiments the power storage device may be a capacitor that is co-packaged within a common electronic package with the signal isolation device circuitry and the signal isolation device includes control circuitry configured to charge the power storage device during a charging cycle. In some embodiments the charging cycle may be performed at a relatively low drive frequency to reduce EMI generation. After the power storage device is charged, or during charging, a data signal can be transmitted by transmit die 120 to receive die 140 to turn on switch 270. Driver circuit 265 may use power stored in power storage device to turn on switch 270. Using a power storage device may increase a rate at which switch 270 is operated as the power to operate the switch is immediately available from the power storage device and does not have to be transmitted across coupler 115. In further embodiments power both from coupler 115 and power storage device may be used to turn on switch 270.

In some embodiments receiver circuit 215 may be formed on a monolithic receive die 140 and may include power converter 260 and driver circuit 265 with switch 270 formed on a separate die, however in other embodiments switch 270 may be monolithically formed on the receive die. In various embodiments one or more components of receiver circuitry 215 may be co-packaged with receiver die 140 and/or may be positioned on a circuit board adjacent to signal isolation device 100. In some embodiments receive die 140 may be formed from silicon, silicon-carbide, gallium arsenide, gallium nitride, diamond or any other suitable semiconductor material. In some embodiments transmit die 120 may be formed from silicon, silicon-carbide, gallium arsenide, gallium nitride, diamond or any other suitable semiconductor material. In some embodiments switch 270 may be formed from silicon, silicon-carbide, gallium arsenide, gallium nitride, diamond or any other suitable semiconductor material.

Figure 2:
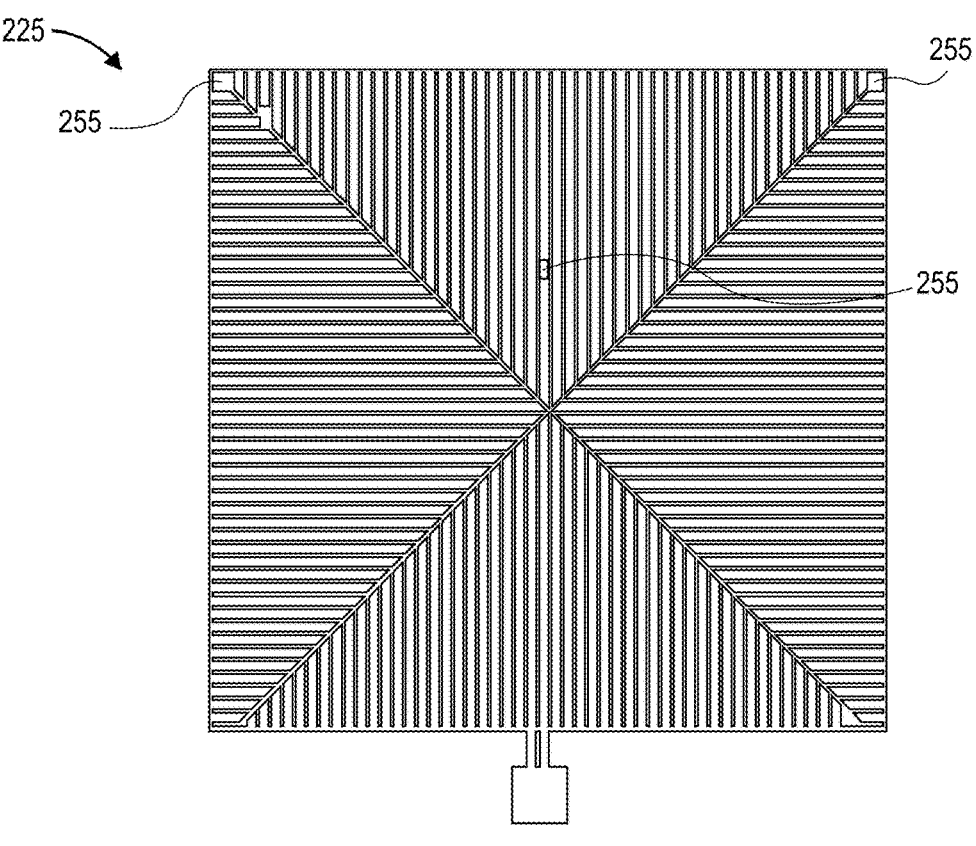
FIG. 2 illustrates a simplified plan view of shield that may be used the signal isolator shown in FIGS. 1A and 1B.

FIG. 2 illustrates a simplified plan view of shield 225 that may be used in signal isolation device 100 shown in FIGS. 1A and 1B. As shown in FIG. 2, shield 225 includes what may be referred to as a herringbone pattern of metal conductors that have relatively small gaps between each conductor. In some embodiments a width of each conductor may be between 20-40 microns and a gap between each conductor may be between 2-10 microns. Such an arrangement may be beneficial for reducing and/or eliminating the formation of eddy currents to improve the effectiveness of shielding receive circuitry 215 (see FIG. 1B) from electromagnetic noise generated by transmit and/or receive coils 240, 235, respectively. Shield 225 may be formed from any suitable electrically conductive metal such as, but not limited to, copper, gold, silver, palladium, aluminum, titanium or nickel.

Shield 225 may include one or more apertures 255 that enable vias 250 (see FIG. 1B) to pass through the layer. In some embodiments shield 225 may have a different configuration and/or may include more than one layer as described in more detail below.

Figure 3:
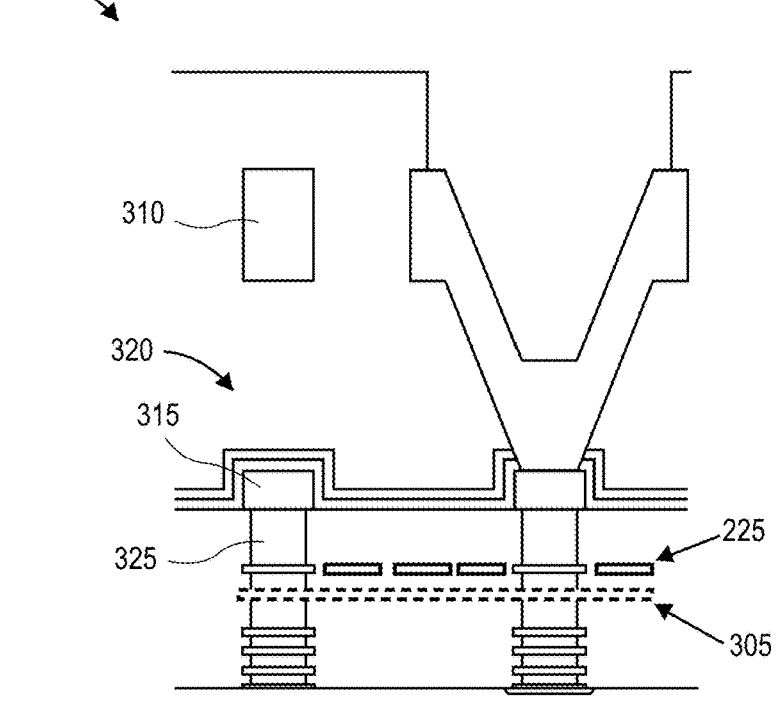
FIG. 3 illustrates a simplified partial cross-sectional view of a portion of a signal isolation device, according to some embodiments of the disclosure.

FIG. 3 illustrates a simplified partial cross-sectional view of a portion of a signal isolation device 300. As shown in FIG. 3, signal isolation device 300 may be similar to signal isolation device 100 shown in FIGS. 1A and 1B, however signal isolation device 300 may use a second shield layer 305 in addition to the first shield layer 225 shown in FIGS. 1B and 2. Signal isolation device 300 includes a transmit coil 310 separated from a receive coil 315 by a dielectric layer 320. One or more vias 325 provide electrical interconnects between the one or more layers. In some embodiments second shield layer 305 may be a continuous or semi-continuous metal layer made from an electrically conductive metal such as, but not limited to, copper, gold, silver, palladium, aluminum or nickel. In some embodiments second shield layer 305 may include one, two, three, four or more layers, some of which are described in more detail below. In other embodiments the vertical order of first and second shield layers 225, 305, respectively, may be reversed.

Figure 4A:
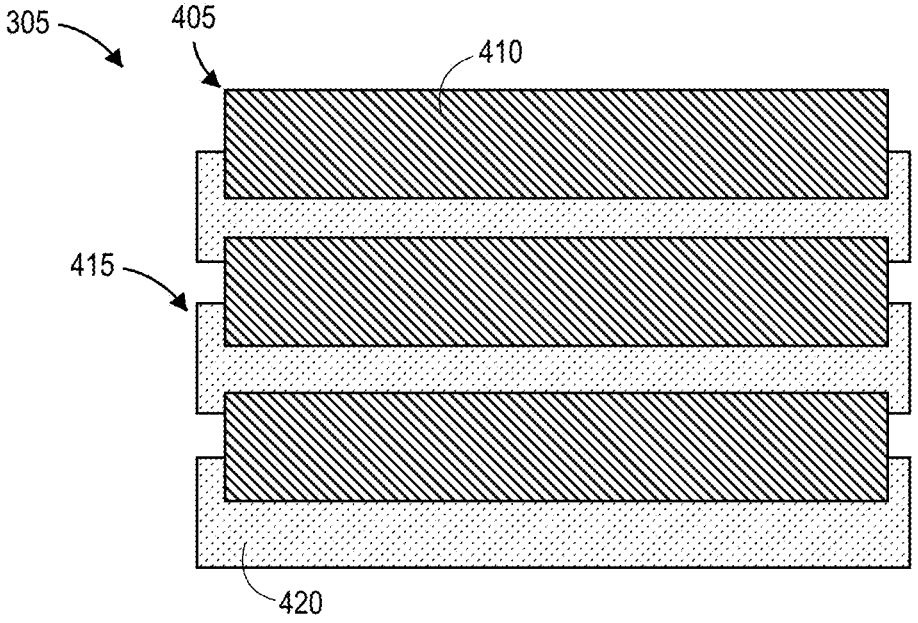
FIG. 4A illustrates a partial plan view of second shield layer, according to some embodiments of the disclosure.
Figure 4B:
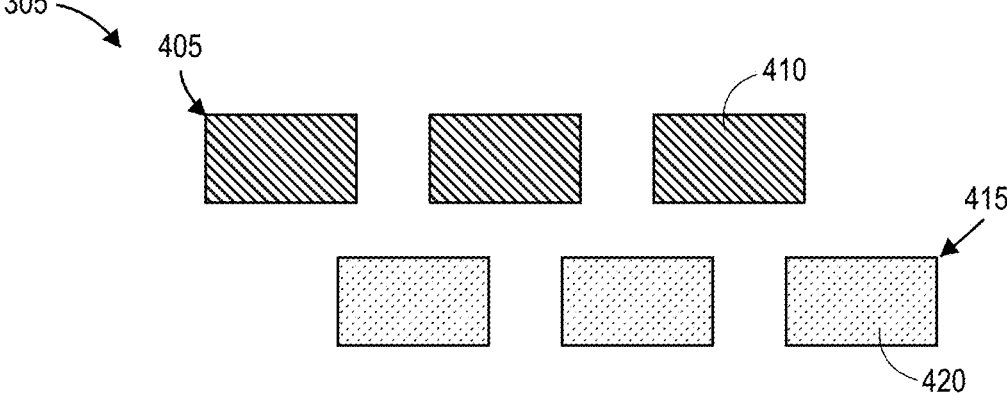
FIG. 4B illustrates a partial cross-sectional view of the second shield layer shown in FIG. 4A.

FIG. 4A illustrates a partial plan view of second shield layer 305 and FIG. 4B illustrates a partial cross-sectional view. As shown in FIGS. 4A and 4B second shield layer 305 may include a first layer 405 having a parallel series of first conductors 410 with gaps therebetween and a second layer 415 having a parallel series of second conductors 420 with gaps therebetween. First conductors 410 may be arranged to be parallel with second conductors 420 where the first conductors are offset from the second conductors such that the first conductors cover the gaps between the second conductors and the second conductors cover the gaps between the first conductors. This arrangement may prevent electric fields that extend through the first gaps from penetrating the second shield layer by blocking fields of the first gaps. One or more dielectric layers (not shown in FIGS. 4A, 4B) may be positioned between first layer 405 and second layer 415. In some embodiments shield layer 305 may be used alone (e.g., as first shield layer) while in other embodiments it may be used in combination with one or more other shield layers. Second shield layer 305 may be a continuous or semi-continuous metal layer made from an electrically conductive metal such as, but not limited to, copper, gold, silver, palladium, aluminum or nickel. In some embodiments a width of each conductor may be increased or decreased a suitable amount as compared to the scale shown in FIGS. 4A and 4B.

Figure 5A:
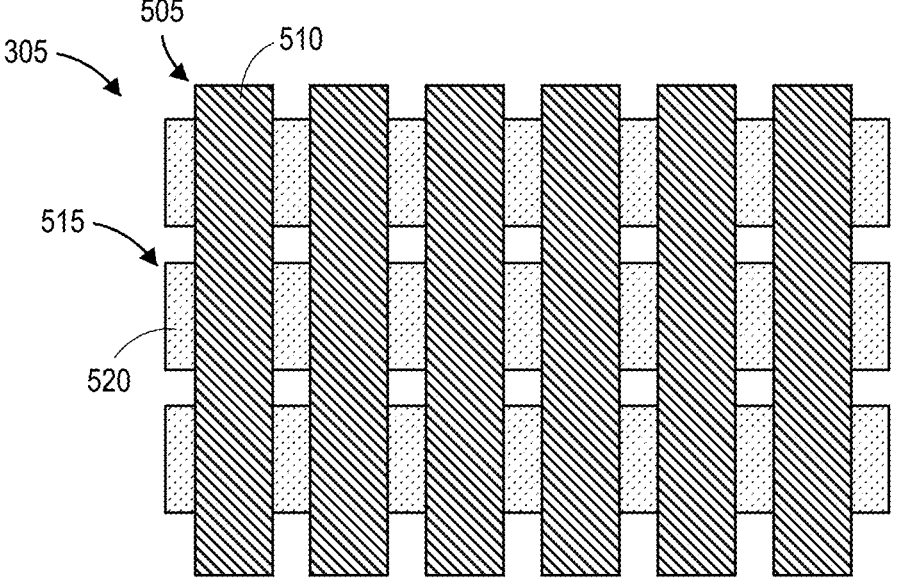
FIG. 5A illustrates a partial plan view of a second shield layer, according to some embodiments of the disclosure.
Figure 5B:
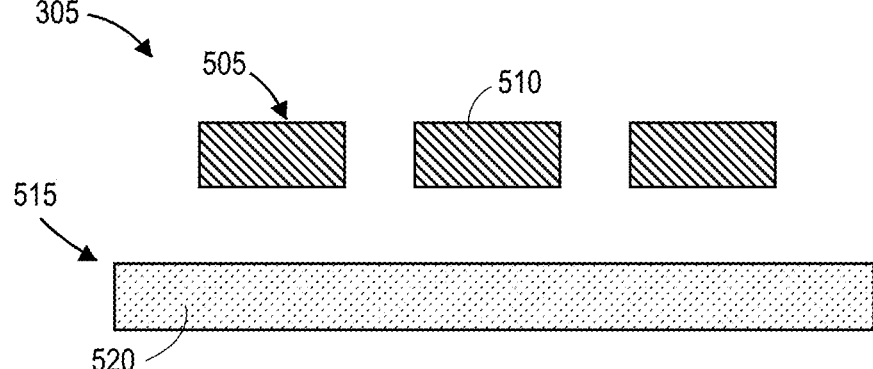
FIG. 5B illustrates a partial cross-sectional view of the second shield layer shown in FIG. 5A.

FIG. 5A illustrates a partial plan view of another embodiment of second shield layer 305 and FIG. 5B illustrates a partial cross-sectional view. As shown in FIGS. 5A and 5B second shield layer 305 may include a first layer 505 having a parallel series of first conductors 510 with gaps therebetween and a second layer 515 having a parallel series of second conductors 520 with gaps therebetween. First conductors 510 may be arranged to be perpendicular to second conductors 520. One or more dielectric layers (not shown in FIGS. 5A, 5B) may be positioned between first layer 505 and second layer 515. In some embodiments second shield layer 305 may be used alone (e.g., as first shield layer) while in other embodiments it may be used in combination with one or more other shield layers. Second shield layer 305 may be a continuous or semi-continuous metal layer made from an electrically conductive metal such as, but not limited to, copper, gold, silver, palladium, aluminum or nickel. In some embodiments a width of each conductor may be increased or decreased a suitable amount as compared to the scale shown in FIGS. 5A and 5B.

The various shield layer configurations described above with respect to FIGS. 1A-5B can be used alone or in combination with each other such that the signal isolation device includes one, two, three, four or more shield layers. Further, the shield layers can be arranged in any suitable vertical order and the repetitive use of one or more shield layer configurations is within the scope of this disclosure.

Figure 6C:
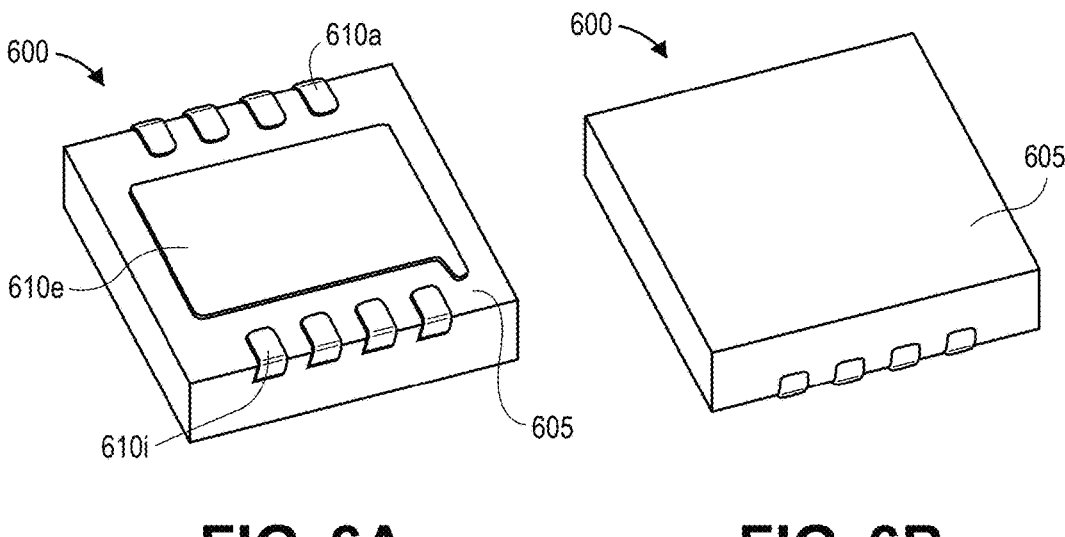
FIG. 6C illustrates a simplified cross-sectional view and FIG. 6D illustrates an isometric partially transparent view.
Figure 6C:
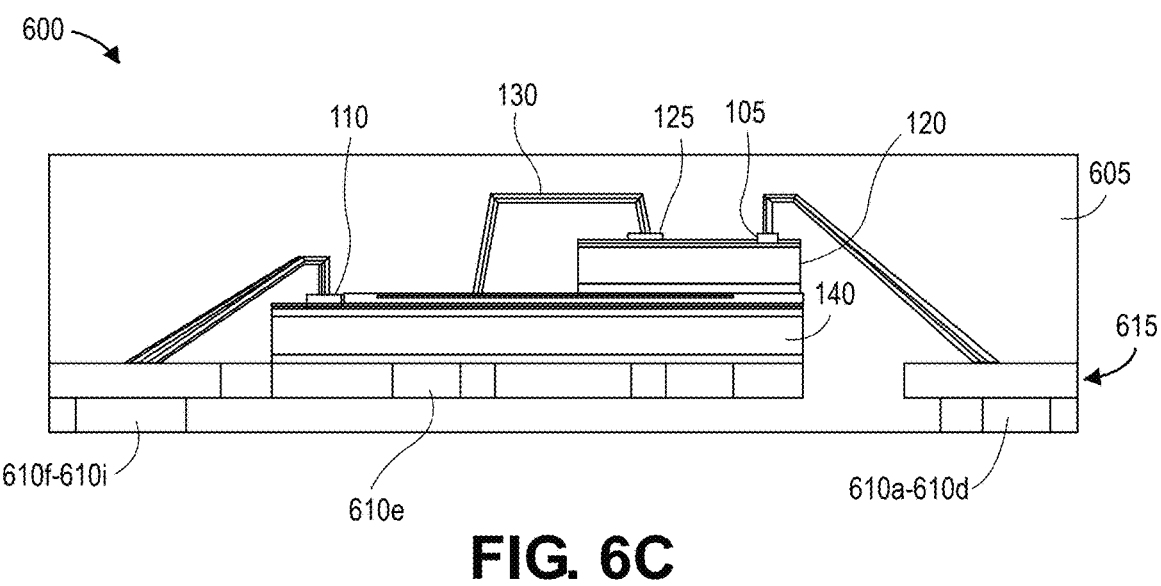
Figure 6D:
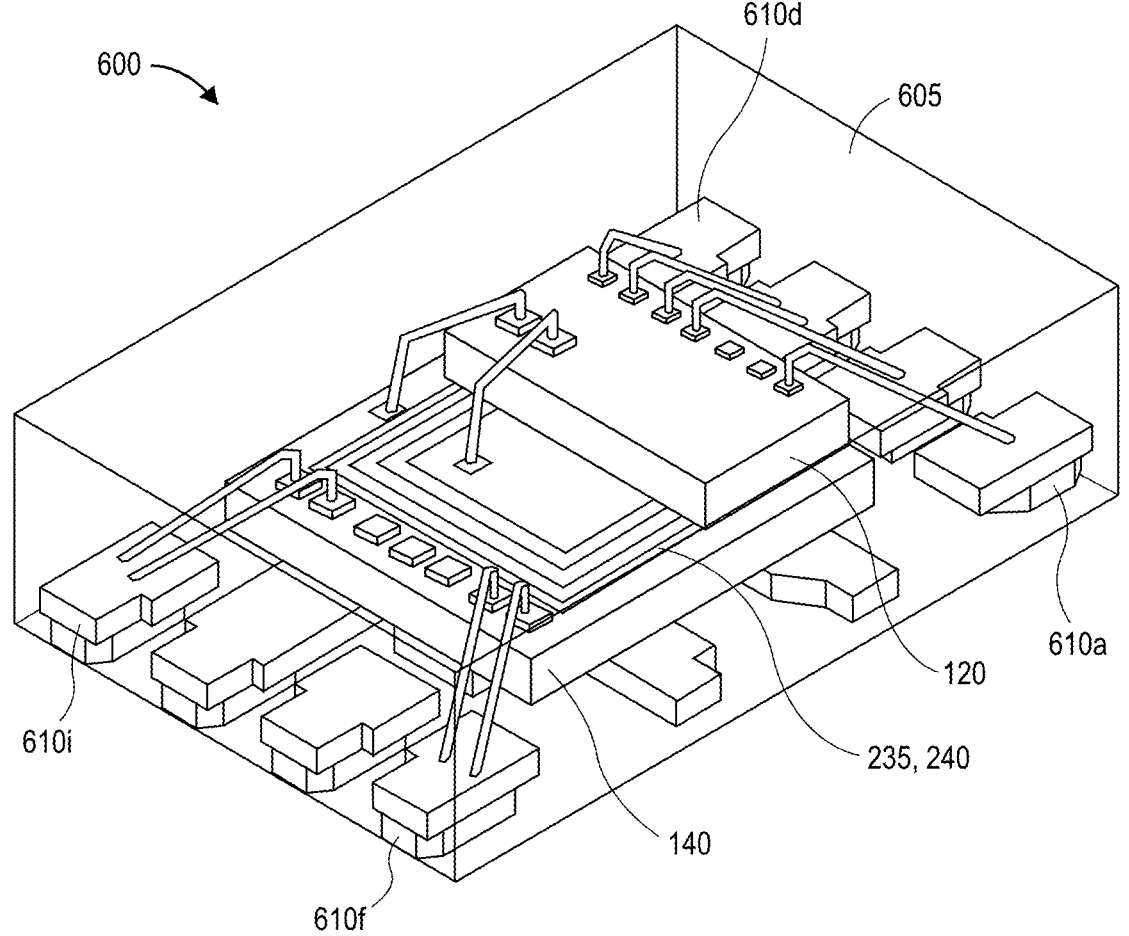

FIG. 6A illustrates an isometric bottom view of a signal isolation device electronic package 600 that may enclose a signal isolation device as described above with reference to FIGS. 1A and 1B, according to embodiments of the disclosure. FIG. 6B illustrates an isometric top view of the electronic package 600, FIG. 6C illustrates a simplified cross-sectional view and FIG. 6D illustrates an isometric partially transparent view. Electronic package 600 may be known as a dual-flat-no-lead (DFN) package but this disclosure is not limited to this construction and other types of suitable packages such as, for example quad-flat-no-lead (QFN), small outline (SO), multichip modules, chip-scale packages (CSP), etc. are within the scope of this disclosure. For example, a QFN package may be used to package two, three, four or more signal isolation devices 100 in a single electronic package.

As shown in FIGS. 6A and 6B, electronic package 600 may include a body 605 formed from a dielectric molding material formed around transmit and receiver die (not shown in FIGS. 6A and 6B). Electronic package may include one or more exterior terminals 610 that can be coupled to a circuit board or other electronic structure and that couple input and output signals to the transmit and receive die within the electronic package.

As shown in FIG. 6C, exterior terminals 610 may be formed from a metal layer 615, which may be a leadframe or other structure. Receiver die 140 is attached to a center terminal 610e, input terminals 105 on transmit die 120 are electrically coupled to exterior input terminals 610a-610d and output terminals 110 on receiver die 140 are electrically coupled to exterior output terminals 610f-610i. Electrical coupling within electronic package 600 can be performed via wirebonding, flip-chip interconnects or other suitable interconnect structure.

As shown in FIG. 6D transmit and receive coils, 240, 235, respectively, are arranged across a majority of the receiver die 140 area to maximize the mutual inductance. In various embodiments an area of receiver die 140 is approximately 1 square millimeter and the coils are distributed across greater than 60 percent of the area, greater than 70 percent of the area, greater than 80 percent of the area or between 90 and 100 percent of the area. In some embodiments one or more active and/or passive electronic components (e.g., resistors, capacitors, inductors, diodes, transistors, etc.) can be integrated within package 600. For example, circuitry can be implemented that converts the received signal into a DC power supply for powering other circuitry on the receiver die and/or supply power to external components outside of the package. As another example, circuitry can be implemented that allows signals to be coupled from the receiver chip back to the transmitter chip to facilitate bi-directional data and/or power transfer. In yet another example, matching components (e.g., capacitors and/or resistors for improved insertion loss and/or return loss), filtering and/or decoupling capacitors can be coupled to input and/or output terminals to improve the performance of the device and/or system.

In some embodiments electronic package 600 may have one or more integral heatsinks formed from a thermally conductive material and arranged to transfer thermal energy away from receive die 140 and/or transmit die 120. In some embodiments in which package 600 is transferring a relatively large amount of power from input terminals to receive terminals a heatsink may be used to remove heat from the dies and transfer it to a circuit board to which package 600 is attached and/or to an external heatsink that may be attached to a top surface of the electronic package.

Figure 7:
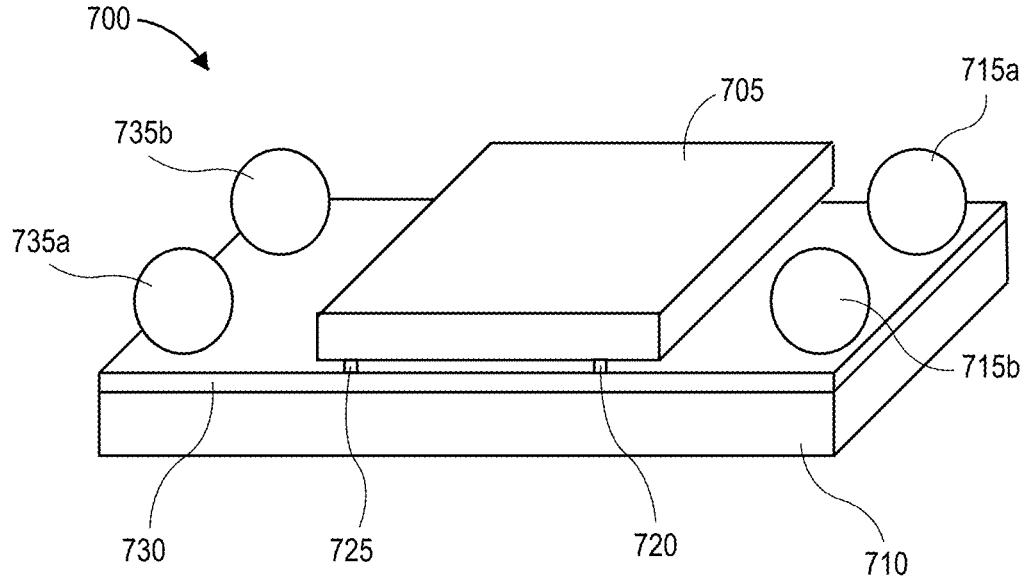
FIG. 7 illustrates a simplified partially transparent isometric view of another embodiment of a signal isolation device 700, according to embodiments of the disclosure.

FIG. 7 illustrates a simplified partially transparent isometric view of another embodiment of a signal isolation device 700, according to embodiments of the disclosure. Signal isolation device 700 may be or may include any of the components, features, or characteristics of any of the signal isolation devices previously described. As shown in FIG. 7 signal isolation device 700 may be a chip-scale package in which a transmit die 705 is attached to a receiver die 710. Input terminals 715a, 715b, which may be solder balls, couple input signals to transmit die 705. The input signals propagate through respective vias 717a, 717b (717b not shown in FIG. 7) disposed in receiver die 710, through respective chip-to-chip interconnects 720a, 720b (which are shown as wirebonds in FIG. 7 but may be flip-chip interconnectors or other suitable interconnects in other embodiments), and into transmit die 705.

Transmit die 705 may perform any of the operations described above to the input signal, including converting it to an intermediate signal that has a time varying electrical voltage. The intermediate signal may be coupled to receiver die 710 through chip-chip interconnects 720c, 720d (which are shown as wirebonds in FIG. 7 but may be flip-chip interconnects or other suitable interconnects in other embodiments). Receiver die 710 conducts the signals to coupler 730 that may include one or more redistribution layers that couple the intermediate signal from a transmit coil to an isolated receive coil, such as those described in more detail above. Receiver die 710 conducts signals from the receive coil to output terminals 715c, 715d (715d not shown in FIG. 7) through respective vias 717c, 717d (717d not shown in FIG. 7). In some embodiments transmit die 705 may include one or more shield layers and/or receiver die 710 may include one or more additional shield layers above or below the transmit receive coils to shield receiver circuitry from electromagnetic fields generated by transmit and receive coils, some of which are described in more detail above.

Terminals 715 may be or may include solder balls, copper pillars, columns or any other suitable type of interconnect. An encapsulant 725 that is electrically insulative may fully or partially encapsulate transmit die 705 and/or receiver die 710. The chip scale packaging arrangement may enable the signal isolation device 700 to be smaller than the electronic package shown in FIGS. 6A-6D and may enable the integration of circuits above and below the transmit coil/receive coil. In some embodiments the active circuitry of receiver die 710 is formed on a bottom surface 713 of the receiver die which provides increased electrical isolation between the transmit coil/receive coil and the active receiver circuitry, however in other embodiments the active receiver circuitry may be formed on a top surface. In further embodiments the active circuitry of the transmit die 705 may be formed on a top surface (as shown in FIG. 7) which may provide increased isolation between the active transmit circuitry and the transmit coil/receive coil, however in other embodiments the active circuitry may be formed on a bottom surface.

Solid-State Relay Device

Figure 8:
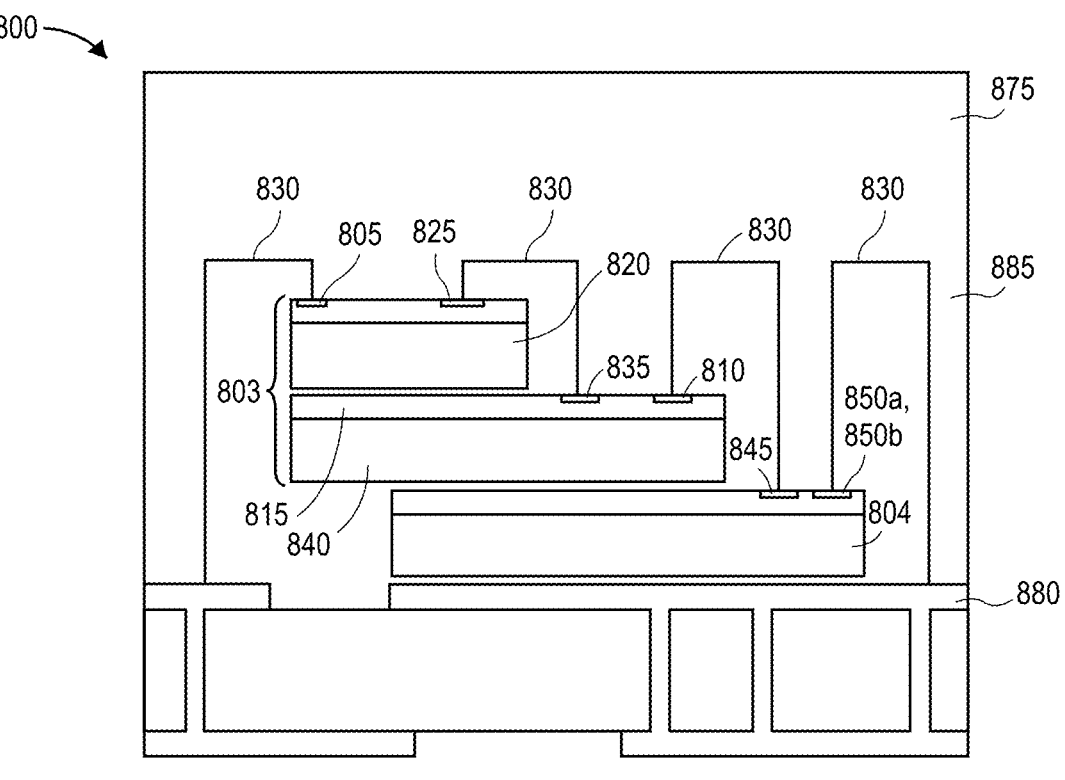
FIG. 8 illustrates a simplified cross-section of a relay device, according to embodiments of the disclosure.

FIG. 8 illustrates a simplified cross-section of a relay device, according to embodiments of the disclosure. As shown in FIG. 8, relay device 800 can include a signal isolation device 803 that may be similar to signal isolation device 100 shown in FIGS. 1A-5B, however the relay device also includes one or more switches 804 that are operated in response to an input signal. Relay device 800 may be or may include any of the components, features, or characteristics of any of the signal isolation devices previously described and the relay device may be included in any of the signal isolation devices as previously discussed. In one embodiment, relay device 800 may include two back-to-back transistors (e.g., two transistors with the source terminals connected together), that operate as a bi-directional switch, 804. The transistors are turned on in response to an input signal and turned off in an absence of an input signal, thus operating as a solid-state relay. In some embodiments the switch 804 consists of two back-to-back gallium nitride field effect transistors (GaN FET) and the signal isolation device 803 produces sufficient current (e.g., greater than 100 microamps) to operate the GaN FETs. In further embodiments, a single GaN FET may be used in place of the bi-directional switch 804.

As shown in FIG. 8A, relay device 800 includes one or more input terminals 805 that receive one or more input signals, one or more output terminals 810 that transmit one or more corresponding output signals to switch 804, and a coupler 815 that couples the one or more input signals to the one or more output terminals, as described in more detail above. In this particular embodiment, signal isolation device 803 includes a transmit die 820 that includes the one or more input terminals 805. Transmit die 820 couples the input signal to transmitter output terminals 825 and may perform filtering, amplification, processing, conditioning or other suitable function to the one or more input signals.

One or more interconnects, for example wirebonds 830, may couple the first transmitter output terminals 825 to receiver input terminals 835 disposed on a receiver die 840. Receiver die 840 couples signals from the receiver input terminals 835 to coupler 815 that is formed on the receiver die. Coupler 815 can employ inductive, capacitive or other suitable structures to generate the one or more output signals that correspond to the one or more input signals. In one example, coupler 815 employs a transmit coil that is inductively coupled to a receive coil (not shown in FIG. 8). More specifically, when an input signal is received by the transmit coil a corresponding signal is generated in the receive coil and transmitted to the one or more output terminals 810. The transmit coil may be electrically isolated from the receive coil such that noise or other harmful or unwanted signals are not coupled from the one or more input terminals 805 to the one or more output terminals 810.

The one or more output terminals 810 may be coupled to switch 804 via interconnects, for example wirebonds 830, that can be connected to a gate terminal 845 of switch 804. Thus, when a sufficient input signal is received by input terminals 805, output terminals 810 conduct current to the gate terminal 845 to transition switch 804 from an off state to an on state. The corresponding relay terminals 850a, 850b are coupled together when the switch is in an on state and are decoupled when the transistor is in an off state. Relay terminals 850a, 850b may be connected to external relay terminals at an exterior of package 875.

In some embodiments switch 804 can withstand relatively high voltages such as greater than 100 volts, greater than 150 volts, greater than 200 volts, greater than 500 volts, greater than 800 volts or greater than 1000 volts. In various embodiments switch 804 can consist of one or more transistors formed with silicon, silicon-carbide, gallium arsenide, gallium nitride, diamond or any other suitable semiconductor material. In some embodiments switch 804 may include a single transistor that operates as a uni-directional switch, two or more switches that operate as a bi-directional switch or three or more switches that operate in a T-switch configuration. A T-switch configuration may be useful for minimizing leakage current at a test terminal and may include three solid-state relays or "switches" arranged in a "T" formation to minimize leakage current between the output to the test apparatus and the test signal input. In further embodiments switch 804 may include one or more electrically isolated uni-directional, bi-directional and/or T-switch circuits.

In the embodiment illustrated in FIG. 8 the transmit die 820, receive die 840 and switch 804 devices are disposed within an electronic package that includes a substrate 880 overmolded with a dielectric mold compound 885 and may be known as a multi-chip module. However, other suitable types of electronic packages can be used such as for example a very thin small outline no lead package (VSON), dual-flat-no-lead (DFN), quad-flat-no-lead (QFN), small outline (SO) or chip-scale packages (CSP), etc. are within the scope of this disclosure. Further, multiple signal isolation devices/transistor devices can be included in a single electronic package, for example, a QFN package may be used to package two, three, four or more signal isolation devices/transistor devices in a single electronic package. In various embodiments one or more active and/or passive electronic components (e.g., resistors, capacitors, inductors, diodes, transistors, etc.) can be integrated within package 875. For example, matching components (e.g., capacitors and/or inductors and/or resistors for improved insertion loss and/or return loss), filtering and/or decoupling capacitors can be coupled to input and/or output terminals to improve the performance of the device and/or system. In another example a transistor driver circuit may be integrated within package 875 that provides a robust, noise immune and reliable drive signal to switch 804.

Figure 9:
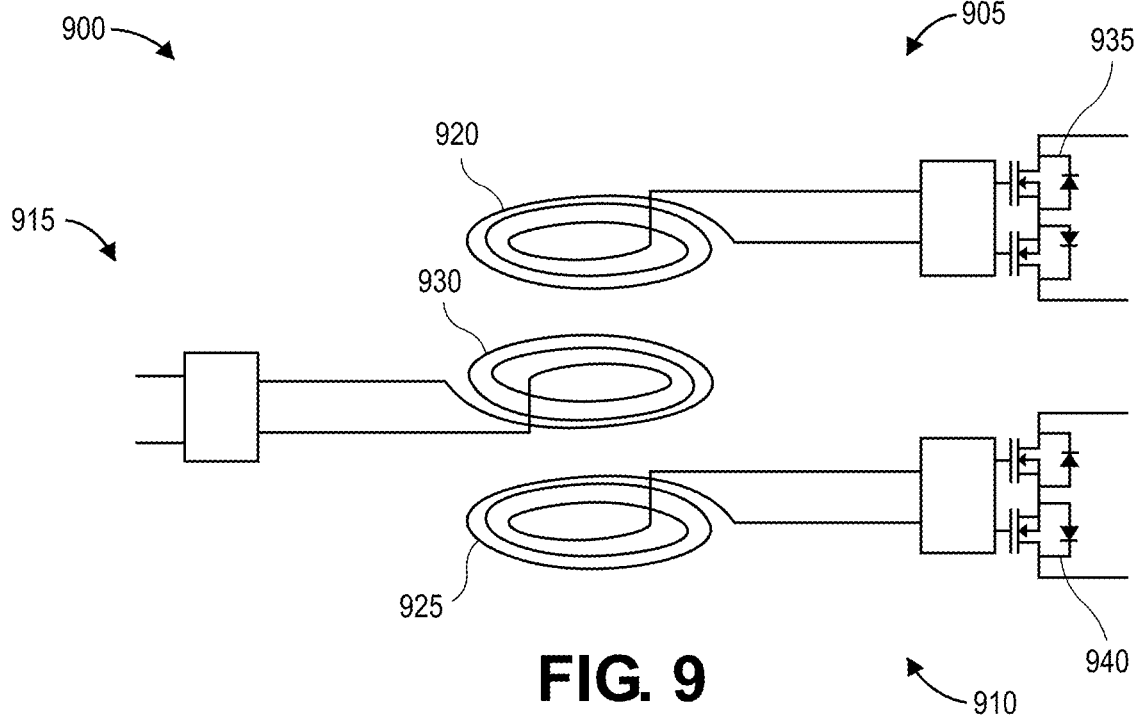
FIG. 9 illustrates a simplified schematic of a multi-channel relay device, according to embodiments of the disclosure.

FIG. 9 illustrates a simplified schematic of a multi-channel relay device, according to embodiments of the disclosure. As shown in FIG. 9 multi-channel relay device 900 may be similar to relay device 800 shown in FIG. 8, however relay device 900 has a first output channel 905 and a second output channel 910 that are driven by a common input 915, and are electrically isolated, as described in more detail below.

In some embodiments the construction of multi-channel relay device 900 may be similar to relay device 800 except the coupler that is disposed on the receiver die includes first and second receive coils, 920, 925, respectively, that are inductively coupled to a single transmit coil 930. Thus, when transmit coil 930 is energized it induces signals in both first and second receive coils, 920, 925, respectively, that are coupled to first and second transistors 935, 940, respectively. In this embodiment, each of first and second transistors 935, 940, respectively, are illustrated as two back-to-back transistors however in other embodiments they may be a single transistor or other suitable device. In further embodiments, the coupler region in any of the embodiments described herein can be replaced with an optocoupler device, a capacitive coupled device or other suitable coupler.

Figure 10:
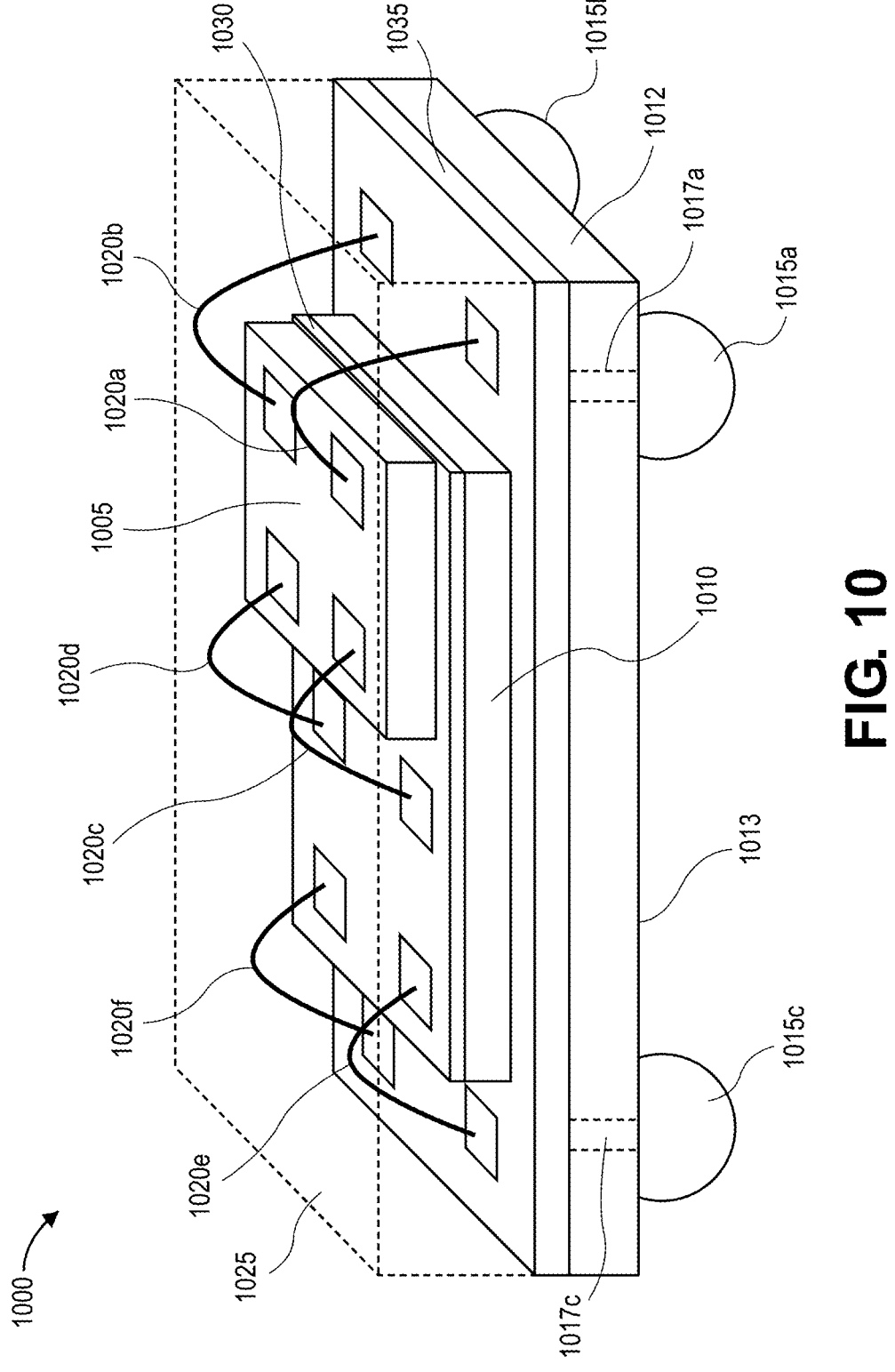
FIG. 10 illustrates a simplified partially transparent isometric view of another embodiment of a relay device 1000, according to embodiments of the disclosure.

FIG. 10 illustrates a simplified partially transparent isometric view of another embodiment of a relay device 1000, according to embodiments of the disclosure. Relay device 1000 may be or may include any of the components, features, or characteristics of any of the signal isolation devices or relay devices previously described. As shown in FIG. 10 relay device 1000 may be a chip-scale package in which a transmit die 1005 is attached to a receiver die 1010 and the receiver die is attached to a switch die 1012. Input terminals 1015a, 1015b, which may be solder balls, couple input signals to transmit die 1005. The input signals propagate through respective vias 1017a, 1017b (1017b not shown in FIG. 10) disposed in switch die 1012, through respective chip-to-chip interconnects 1020a, 1020b (which are shown as wirebonds in FIG. 10 but may be flip-chip interconnectors or other suitable interconnects in other embodiments), and into transmit die 1005.

Transmit die 1005 may perform any of the operations described above to the input signal, including converting it to an intermediate signal that has a time varying electrical voltage. The intermediate signal may be coupled to receiver die 1010 through chip-chip interconnects 1020c, 1020d (which are shown as wirebonds in FIG. 10 but may be flip-chip interconnects or other suitable interconnects in other embodiments). Receiver die 1010 conducts the signals to coupler 1030 that may include one or more redistribution layers that couple the intermediate signal from a transmit coil to an isolated receive coil, such as those described in more detail above. Receiver die 1010 conducts signals from the receive coil to switch die 1012 that includes one or more solid-state switches. In some embodiments the one or more solid-state switches are located on a bottom surface 1013 of switch die and therefore vias 1017c, 1017d (1017d not shown in FIG. 10) conduct the signals to the one or more switches. The one or more switches may operate to create an electrical connection between output terminals 1015c, 1015d (1015d not shown in FIG. 10) in response to the input terminals 1015a, 1015b receiving the input signal. In some embodiments switch die 1012 may include a redistribution and/or shielding layer 1035 that can provide signal routing and/or signal shielding capabilities. In further embodiments one or more switch driver circuits for operating the one or more solid-state switches may also be formed on bottom surface 1013 while in other embodiments the switch driver circuits may be formed on receiver die 1010. In some embodiments transmit die 1005 may include one or more shield layers and/or receiver die 1010 may include one or more additional shield layers above or below the transmit receive coils (in coupler 1030) to shield receiver circuitry from electromagnetic fields generated by transmit and receive coils, some of which are described in more detail above.

Terminals 1015 may be or may include solder balls, copper pillars, columns or any other suitable type of interconnect. An encapsulant 1025 that is electrically insulative may fully or partially encapsulate transmit die 1005, receiver die 1010 and/or switch die 1012. The chip scale packaging arrangement may enable the relay device 1000 to be smaller than the electronic package shown in FIG. 8 and may enable the integration of circuits above and below the transmit coil/receive coil. In some embodiments the active circuitry of receiver die 1010 is formed on a bottom surface of the receiver die which provides increased electrical isolation between the transmit coil/receive coil and the active receiver circuitry, however in other embodiments the active receiver circuitry may be formed on a top surface. In further embodiments the active circuitry of the transmit die 1005 may be formed on a top surface (as shown in FIG. 10) which may provide increased isolation between the active transmit circuitry and the transmit coil/receive coil, however in other embodiments the active circuitry may be formed on a bottom surface.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

Terms "and," "or," and "an/or," as used herein, may include a variety of meanings that also is expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, B, C, AB, AC, BC, AA, AAB, ABC, AABBCCC, etc.

Reference throughout this specification to "one example," "an example," "certain examples," or "exemplary implementation" means that a particular feature, structure, or characteristic described in connection with the feature and/or example may be included in at least one feature and/or example of claimed subject matter. Thus, the appearances of the phrase "in one example," "an example," "in certain examples," "in certain implementations," or other like phrases in various places throughout this specification are not necessarily all referring to the same feature, example, and/or limitation. Furthermore, the particular features, structures, or characteristics may be combined in one or more examples and/or features.

In some implementations, operations or processing may involve physical manipulation of physical quantities. Typically, although not necessarily, such quantities may take the form of electrical or magnetic signals capable of being stored, transferred, combined, compared, or otherwise manipulated. It has proven convenient at times, principally for reasons of common usage, to refer to such signals as bits, data, values, elements, symbols, characters, terms, numbers, numerals, or the like. It should be understood, however, that all of these or similar terms are to be associated with appropriate physical quantities and are merely convenient labels. Unless specifically stated otherwise, as apparent from the discussion herein, it is appreciated that throughout this specification discussions utilizing terms such as "processing," "computing," "calculating," "determining," or the like refer to actions or processes of a specific apparatus, such as a special purpose computer, special purpose computing apparatus or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

In the preceding detailed description, numerous specific details have been set forth to provide a thorough understanding of claimed subject matter. However, it will be understood by those skilled in the art that claimed subject matter may be practiced without these specific details. In other instances, methods and apparatuses that would be known by one of ordinary skill have not been described in detail so as not to obscure claimed subject matter. Therefore, it is intended that claimed subject matter not be limited to the particular examples disclosed, but that such claimed subject matter may also include all aspects falling within the scope of appended claims, and equivalents thereof.

What is claimed is:

1. A method of operating a solid-state relay device, the method comprising:

receiving an input signal at an input of a transmit die and in response to receiving the input signal generating a corresponding time varying electrical voltage at a transmitter output of the transmit die;

coupling the time varying electrical voltage from the transmitter output of the transmit die to a receiver input of a receiver die;

coupling the time varying electrical voltage from the receiver input to a transmit coil disposed within the receiver die;

inducing a receive coil to generate an intermediate signal in response to the coupling the time varying electrical voltage to the transmit coil, wherein the intermediate signal corresponds to the input signal, and wherein the receive coil is disposed in the receiver die;

coupling the intermediate signal to receiver circuitry disposed within the receiver die;

converting the intermediate signal to a DC voltage using a power converter circuit disposed in the receiver die;

generating a switch drive signal from the DC voltage using a driver circuit disposed in the receiver die;

transitioning a solid-state switch from an off state to an on state in response to the solid-state switch receiving the switch drive signal; and shielding electromagnetic noise generated by the receive coil from the receiver circuitry via a shield positioned between the receive coil and the receiver circuitry.

2. The method of claim 1, wherein the solid-state switch includes a first transistor having a first gate, a first source and a first drain, wherein the solid-state switch further includes a second transistor having a second gate, a second source and a second drain, wherein the first source is connected to the second source forming a bidirectional switch and wherein the first gate and the second gate are arranged to receive the switch drive signal.

3. The method of claim 1, wherein the transmit die is attached to the receiver die.

4. The method of claim 3, wherein the receiver die is attached to a switch die that includes the solid-state switch.

5. The method of claim 1, wherein the receive coil is a first receive coil and the intermediate signal is a first intermediate signal and wherein the solid-state relay device further comprises a second receive coil that generates a second intermediate signal in response to the coupling the time varying electrical voltage to the transmit coil.

6. The method of claim 5, wherein the switch drive signal is a first switch drive signal and the solid-state switch is a first solid-state switch, and wherein the method further comprises generating a second switch drive signal from the DC voltage wherein the second switch drive signal transitions a second solid-state switch from an off state to an on state in response to the second solid-state switch receiving the second switch drive signal.

7. The method of claim 1, wherein the input signal corresponds to the DC voltage and wherein the DC voltage is electrically isolated from the input signal.

8. The method of claim 1, wherein the solid-state relay device further comprises a power storage device, and wherein the power converter circuit uses energy stored in the power storage device to generate the DC voltage.

9. The method of claim 1, wherein the transmit die includes data modulation circuitry that couples data onto time varying electrical voltage.

10. The method of claim 1, wherein the receiver circuitry includes data demodulation circuitry that demodulates data from the intermediate signal.

11. A method of forming a solid-state relay, the method comprising:

attaching a receiver die to a switch die, wherein the receiver die includes a pair of receiver input terminals, a pair of output terminals and a coupler region, wherein the coupler region includes:

a transmit coil;

a receiver coil positioned proximate the transmit coil and connected to the pair of output terminals;

receiver circuitry connected to the receiver coil; and a shield layer positioned between the receiver circuitry and the receiver coil; and attaching a transmit die to the receiver die wherein the transmit die includes a pair of input terminals coupled to a pair of transmitter output terminals;

forming one or more electrical connections between the transmit die and the receiver die such that the transmit coil is connected to the pair of transmitter output terminals;

forming one or more electrical connections between the switch die and the receiver die such that the receiver circuitry is coupled to a solid-state switch disposed on the switch die; and at least partially encapsulating the receiver die, the switch die and the transmit die in an electrically insulative material.

12. The method of claim 11, wherein the transmit die includes transmit circuitry arranged to generate a time varying electrical voltage in response to receiving an input signal at the input terminals.

13. The method of claim 12 wherein the time varying electrical voltage is coupled to the transmit coil, and in response to receiving the time varying electrical voltage the transmit coil induces the receiver coil to generate an intermediate signal corresponding to the input signal.

14. The method of claim 13, wherein the solid-state relay further comprises a power storage device coupled to the receiver circuitry, and wherein the receiver circuitry is configured to cause the power storage device to generate a DC signal in response to the generation of the intermediate signal.

15. The method of claim 13, wherein the receiver circuitry generates a DC voltage in response to the generation of the intermediate signal.

16. The method of claim 15, wherein the DC voltage is a first DC voltage and wherein the receiver circuitry generates a second DC voltage in response to the generation of the intermediate signal, wherein the second DC voltage is greater than the first DC voltage.

17. A method of operating a solid-state relay device, the method comprising:

receiving an input signal at an input of the solid-state relay device;

coupling the input signal to transmit circuitry disposed on a transmit die and in response to receiving the input signal the transmit circuitry generates a corresponding time varying electrical voltage;

coupling the time varying electrical voltage from the transmit circuitry to a transmit coil disposed within a separate receiver die;

inducing a receive coil to generate an intermediate signal in response to the coupling the time varying electrical voltage to the transmit coil, wherein the intermediate signal corresponds to the input signal, and wherein the receive coil is disposed in the receiver die;

coupling the intermediate signal to receiver circuitry disposed within the receiver die;

generating a switch drive signal in response to the coupling the intermediate signal to the receiver circuitry; and transitioning a solid-state switch from an off state to an on state in response to the solid-state switch receiving the switch drive signal;

wherein the switch drive signal corresponds to the input signal and wherein the drive signal is electrically isolated from the input signal.

18. The method of claim 17 further comprising shielding electromagnetic noise generated by the receive coil from the receiver circuitry via a shield positioned between the receive coil and the receiver circuitry.

19. The method of claim 17, wherein the solid-state switch is a bidirectional switch having first and second gates that receive the drive signal.

20. The method of claim 19, wherein method further comprises generating an auxiliary DC voltage in response to the coupling the intermediate signal to the receiver circuitry.

\* \* \* \* \*